US011531263B2

(12) United States Patent
Tu et al.

(10) Patent No.: US 11,531,263 B2
(45) Date of Patent: Dec. 20, 2022

(54) PHOTOMASK HAVING A PLURALITY OF SHIELDING LAYERS

(71) Applicant: Taiwan Semiconductor Manufacturing Company, Ltd., Hsin-Chu (TW)

(72) Inventors: Chih-Chiang Tu, Tauyen (TW); Chun-Lang Chen, Madou Township (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/405,278

(22) Filed: Aug. 18, 2021

(65) Prior Publication Data

US 2021/0373433 A1    Dec. 2, 2021

Related U.S. Application Data

(63) Continuation of application No. 16/879,889, filed on May 21, 2020, now Pat. No. 11,099,476, which is a continuation of application No. 16/153,935, filed on Oct. 8, 2018, now Pat. No. 10,670,956, which is a continuation of application No. 15/362,089, filed on Nov. 28, 2016, now Pat. No. 10,095,102.

(60) Provisional application No. 62/321,448, filed on Apr. 12, 2016.

(51) Int. Cl.
*G03F 1/26* (2012.01)
*G03F 1/54* (2012.01)

(52) U.S. Cl.
CPC . *G03F 1/26* (2013.01); *G03F 1/54* (2013.01)

(58) Field of Classification Search
CPC ..................................... G03F 1/26; G03F 1/54
USPC ............................................................. 430/5
See application file for complete search history.

(56) References Cited

U.S. PATENT DOCUMENTS

| 10,095,102 B2 | 10/2018 | Tu et al. |
| 2012/0100466 A1 | 4/2012 | Hashimoto et al. |
| 2016/0054650 A1 | 2/2016 | Nam et al. |
| 2016/0077424 A1 | 3/2016 | Fukaya et al. |

FOREIGN PATENT DOCUMENTS

KR    20100134454 A    12/2010

OTHER PUBLICATIONS

Non-Final Office Action dated Feb. 1, 2018 for U.S. Appl. No. 15/362,089.
Notice of Allowance dated May 31, 2018 for U.S. Appl. No. 15/362,089.
Non-Final Office Action dated Sep. 4, 2019 for U.S. Appl. No. 16/153,935.
Final Office Action dated Dec. 12, 2019 for U.S. Appl. No. 16/153,935.
Notice of Allowance dated Jan. 29, 2020 for U.S. Appl. No. 16/153,935.
Non-Final Office Action dated Jan. 25, 2021 for U.S. Appl. No. 16/879,889.
Notice of Allowance dated Apr. 21, 2021 for U.S. Appl. No. 16/879,889.

*Primary Examiner* — Christopher G Young
(74) *Attorney, Agent, or Firm* — Eschweiler & Potashnik, LLC

(57) ABSTRACT

Some embodiments relate to photomask for mask patterning. The photomask includes a transparent layer comprising quartz, and a molybdenum silicide (MoSi) layer overlying the transparent layer. A first shielding layer overlies the MoSi layer and has a first thickness and a first optical density. A second shielding layer overlies the first shielding layer and has a second thickness and a second optical density. The second thickness is less than one third of the first thickness, and the second optical density is less than one fourth of the first optical density. An overall optical density of the first and second shielding layers is at least 1.8.

20 Claims, 9 Drawing Sheets

PHOTOMASK HAVING A PLURALITY OF SHIELDING LAYERS

REFERENCE TO RELATED APPLICATIONS

This application is a Continuation of U.S. application Ser. No. 16/879,889, filed on May 21, 2020, which is a Continuation of U.S. application Ser. No. 16/153,935, filed on Oct. 8, 2018 (now U.S. Pat. No. 10,670,956, issued on Jun. 2, 2020), which is a Continuation of U.S. application Ser. No. 15/362,089, filed on Nov. 28, 2016 (now U.S. Pat. No. 10,095,102, issued Oct. 9, 2018), which claims the benefit of U.S. Provisional Application No. 62/321,448, filed on Apr. 12, 2016. The contents of the above-referenced patent applications are hereby incorporated by reference in their entirety.

BACKGROUND

Integrated circuits (ICs) are manufactured by transferring geometric patterns from photomasks to light-sensitive material known as "photoresist". In particular, a geometric pattern is formed on a layer of photoresist on a semiconductor substrate by providing light through a photomask. The photomask includes a transparent layer that is partially covered with an opaque material. The portions of the transparent layer covered with opaque material block light, while the remaining uncovered portions of the transparent substrate allow light to pass there through, such that the light passing through the photomask transfers a pattern to the photoresist. After the photoresist has been exposed in this fashion, the photoresist is developed to selectively remove portions of the photoresist which were exposed to (or not exposed to) light, depending on whether the photoresist has a negative or positive tone. In some instances, the underlying wafer can then be etched with the patterned photoresist in place and the photoresist layer can be subsequently removed. Multiple patterned layers can be built up on the IC in this fashion to fabricate overall IC design.

DETAILED DESCRIPTION

Figure 1:
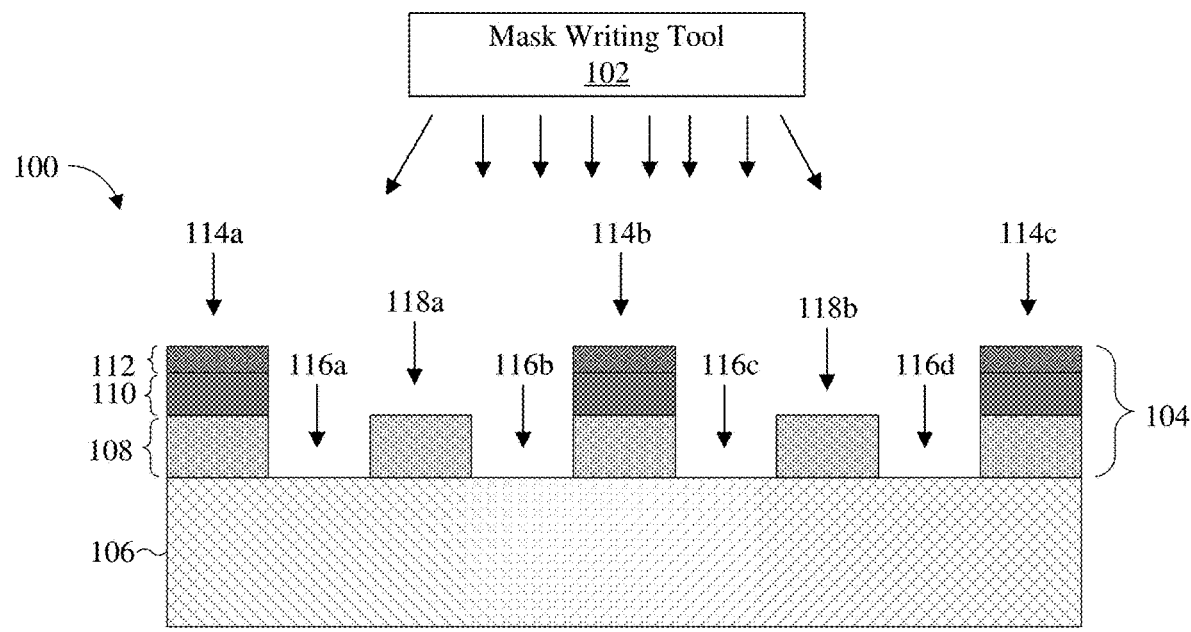
FIG. 1 illustrates an embodiment of a photomask having multiple shielding layers.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In response to increasing miniaturization of integrated circuits (IC), device structures are more densely arranged on a substrate. The dense arrangement of device structures makes precision and accuracy in the formation and arrangement of the device structures increasingly important. Typically, the device structures are formed on the substrate using photolithography. In photolithography, light is used to transfer a pattern from a photomask to a photoresist on the substrate. The light used to transfer the pattern is a function of optical density.

Optical density is the logarithmic ratio of the intensity of transmitted light to the intensity of the incident light passing through substance material. In particular, the optical density of a material relates to the sluggish tendency of the atoms of the material to maintain the absorbed energy of an electromagnetic wave in the form of vibrating electrons before reemitting it as a new electromagnetic disturbance. The more optically dense that a material is, the slower that a wave will move through the material. In some embodiments, optical density is measured as the absorbed radiation of the corresponding wavelength. One indicator of the optical density of a material is the index of refraction value of the material. Accordingly, optical density can refer to the absorbance of a particular layer, a combination of layers, or a structure.

To achieve miniaturization, finer photoresist patterns are used to form device structures. However, the thickness of the photomask and/or photoresist can cause light scattering that results in undesirable pattern variation. Accordingly, reduction in the thickness of the photomask and/or photoresist can improve pattern fidelity. Furthermore, creating a photomask corresponding to the desired pattern includes multiple steps of layering and etching. The more complex this process, the more likely the complexity is to induce loading effects, such as, blurring, rounding, and shortening of the pattern. Accordingly, simplifying the process of creating the patterned photomask would also improve pattern fidelity.

Here, a photomask having a plurality of shielding layers is described. In some embodiments the photomask includes a phase shift layer overlying the transparent layer and at least two shielding layers overlying the phase shift layer. The thickness and composition of a shielding layer can be tuned to achieve a particular optical density for that shielding layer. Because the shielding layer is formed to block the transmission of light, a specific optical density may be desired to achieve a pattern. Because at least two layers are used, the thickness of the shielding layer is not based solely on the optical density of a single layer, but rather the optical density of the combined shielding layers.

For example, typically chromium is used as a shielding layer. However, to achieve a desired optical density of 1.8, a chromium shielding layer would have to be 52 nanometers (nm) thick, which is relatively thick and can cause fidelity issues. To reduce these fidelity issues, at least two shielding layers with different thicknesses and different optical densities from one another can be used to achieve a multi-layer shielding layer with the same optical density as the 52 nm chromium shielding layer but with a thinner overall profile than 52 nm. For example, a first shielding layer may be 5 nm thick and have an optical density of 0.23, while a second shielding layer may be 24 nm thick and have an optical density of 1.6. Accordingly, the combined optical density of the pair of shielding layers is greater than 1.8 with a combined thickness of 29 nm instead of the larger 52 nm single shielding layer of chromium. This may reduce the overall size of the patterned photomask while increasing the overall optical density, such as to 3.0. Thereby, making the patterned photomask thinner with a higher optical density, and thus, improving pattern fidelity.

Furthermore, the composition of the at least two shielding layers can be selected to simplify the process of creating the photomask in order to reduce loading effects. Suppose that a first shielding layer overlies the phase shift layer, and a second shielding layer overlies the first shielding layer. The materials for the first and second shielding layers may be selected so that both the first and second shielding layer can be etched by one etchant. Likewise, the material of the first shielding layer may be selected so that a single etchant can etch both the first shielding layer and the phase shift layer. Thus, the first shielding layer does not require its own separate etching step. In this manner, the process for creating the photomask can be simplified, thereby further improving the pattern fidelity.

FIG. 1 illustrates some embodiments of a mask patterning system 100 having a mask writing tool 102 configured to pattern a patterned photomask stack 104. The patterned photomask stack 104 overlies a transparent layer 106, thereby generating a photomask. The mask writing tool 102 is configured to produce a pattern in a photoresist layer (not shown). The patterned photomask stack 104 includes sections of a phase shift layer 108, a first shielding layer 110, and a second shielding layer 112. The pattern in the photoresist layer is transferred by strategically etching the phase shift layer 108, the first shielding layer 110, and the second shielding layer 112 to create patterned photomask stack 104. In various embodiments, the patterned photomask stack 104 may be a binary intensity mask (BIM) or attenuated phase shift mask (APSM). Once the patterned photomask stack 104 is etched, the photoresist can be removed.

Strategic etching of the patterned photomask stack 104 into layered sections allows the photomask to develop a desired pattern. In some regions, such as 114a, 114b, and 114c the incident radiation is blocked by sections of the first shielding layer 110 and the second shielding layer 112. The first and second shielding layers 110, 112 are opaque layers that block the transmission of electromagnetic radiation through the transparent layer 106. The light blocking function of the first and second shielding layers 110, 112 can be accomplished even though the first shielding layer 110 and the second shielding layer 112 have a combined thickness less than that of a typical shielding layer due to the combined optical density of the first and second shielding layers 110, 112.

When incident radiation is able to strike the transparent layer 106, for example at regions 116a, 116b, 116c, and 116d, the incident radiation causes a pattern to be formed on a wafer, as will be discussed with respect to FIGS. 2A and 2B. In other regions, such as regions 118a and 118b, the incident radiation passes through the phase shifting layer 108 to the transparent layer 106. The phase shift layer 108 is configured to allow a small amount of radiation to be transmitted through (typically just a few percent). That radiation is not strong enough to create a pattern in and of itself. Instead, the radiation passing through the phase shift layer 108 causes interference in the radiation coming through the surrounding regions of transparent layer 106 to improve pattern fidelity.

The regions 114a-c, 116a-d, and 118a-b of the patterned photomask stack 104, are formed such that together the regions cause a pattern to be formed on the wafer when the radiation passes through the patterned photomask stack 104 to a wafer.

Figure 2A:
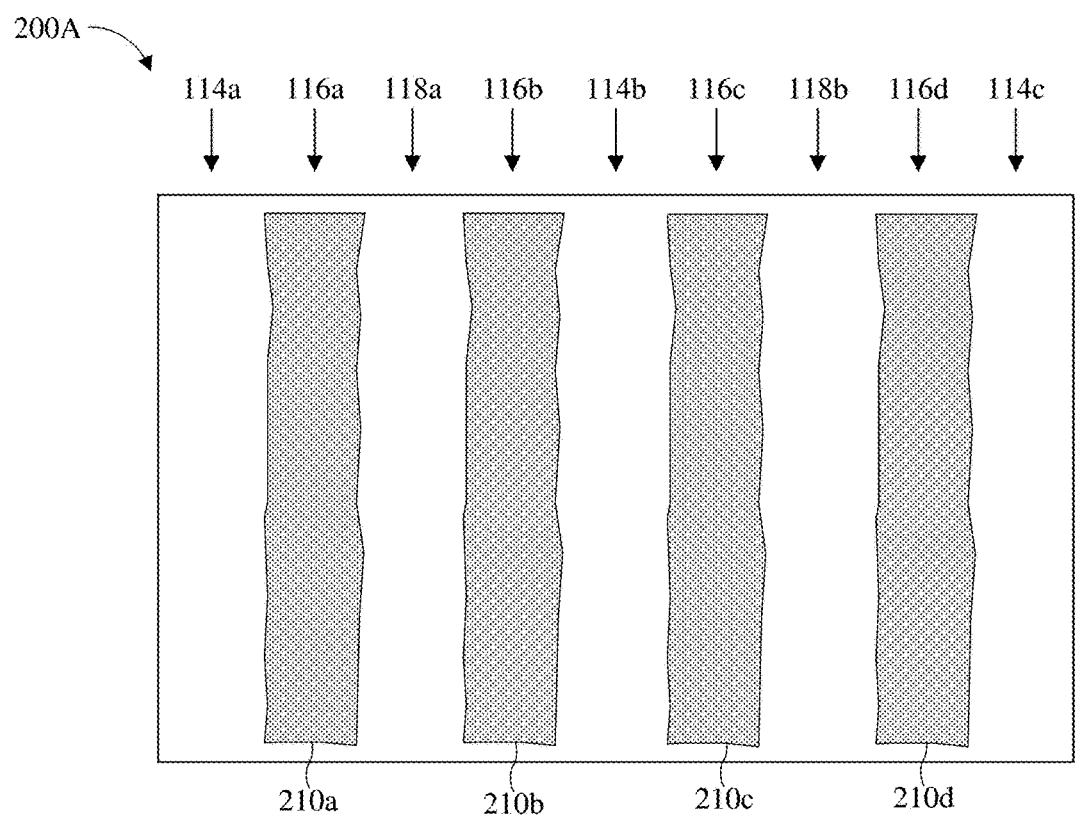
FIG. 2A illustrates one embodiment of a patterned wafer corresponding to the photomask shown in FIG. 1.

FIG. 2A illustrates an example embodiment of wafer 200A that would theoretically result from use of the photomask described with respect to FIG. 1. For example, portions of the wafer 200A underlying regions 114a, 114b, and 114c do not result in the wafer being patterned. While portions of the wafer 210A underlying regions 116a, 116b, 116c, and 116d are patterned as exemplified by patterned portions 200a, 210b, 210c, and 210d of the wafer 200A. As described above, even though incident radiation at regions 118a and 118b does not pass through the first shielding layer 110 and the second shielding layer 112 (shown in FIG. 1), the phase shift layer 108 (shown in FIG. 1) only allows a small percentage of light to pass through which does not result in patterning. Accordingly, portions of the wafer 200A underlying regions 118a and 118b are not patterned.

Figure 2B:
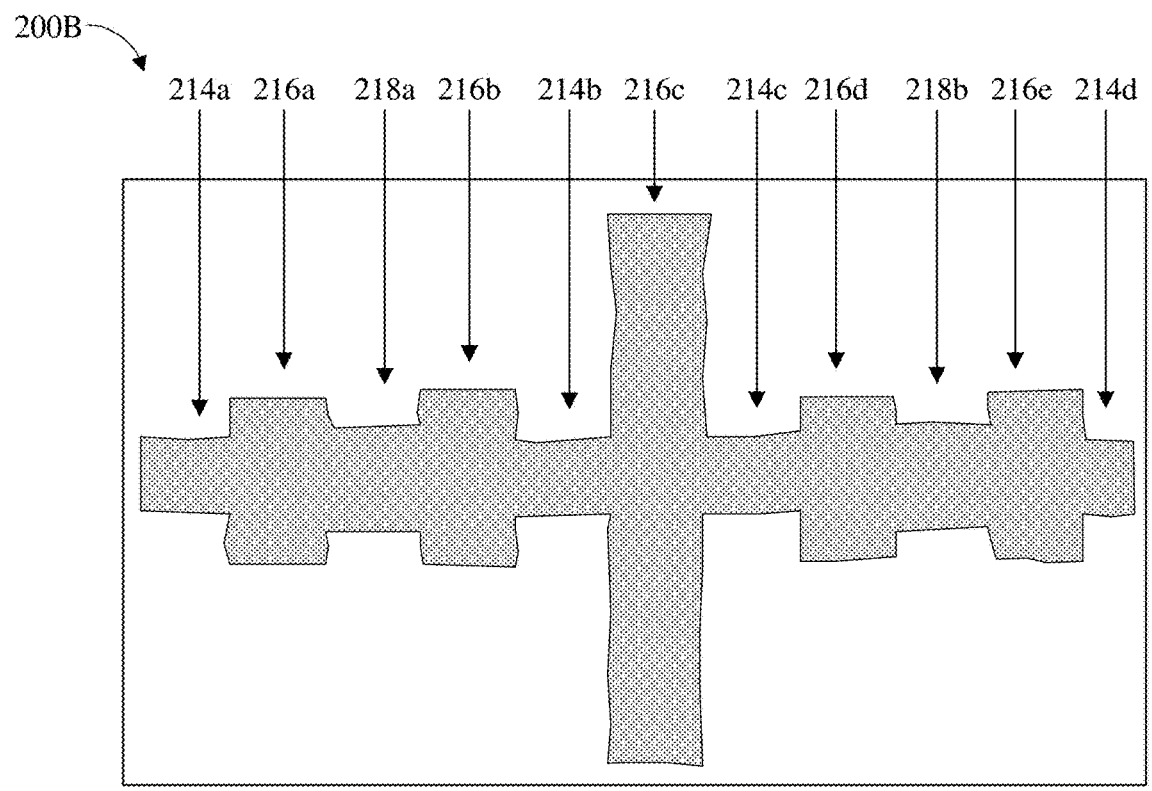
FIG. 2B illustrates another embodiment of a patterned wafer corresponding to the photomask shown in FIG. 1.

FIG. 2B illustrates an alternative embodiment of wafer 200B that would theoretically result from use of the photomask described with respect with FIG. 1 depending on the three dimensional nature of the patterned photomask stack 104. For example, portions of the three-dimensional wafer 200B underlying regions 214a, 214b, 214c, and 214d results in the wafer being patterned in a limited manner underlying those areas. In this embodiment, the wafer 200B regions underlying 216a, 216b, 216c, 216d, and 216e may patterned in a less limited manner than the regions underlying 214a, 214b, 214c, and 214d because the patterned photomask stack 104 does not overlie the regions 216a, 216b, 216c, 216d, and 216e. Likewise, regions underlying 218a and 218b are patterned more than regions underlying 214a, 214b, 214c, and 214d and less than regions underlying 216a, 216b, 216c, 216d, and 216e due to the phase shift layer 108.

Using the patterned photomask stack 104, the critical dimension (i.e., the minimum feature size) can be improved. For example, critical dimension uniformity can be generally improved by 20% using the phase shift layer 108, the first shielding layer 110, and the second shielding layer 112 of the patterned photomask stack 104. However, the critical dimension may be improved even more depending on the specific application. For example, in one application, the patterned photomask stack 104 is used to form a static random-access memory (SRAM) chip on a wafer, such as the wafer 200A or 200B. The critical dimension uniformity for an SRAM, patterned using the patterned photomask stack 104, can be improved by 50%.

Moreover, the two-dimensional (2D) fidelity is also improved. For example, a mean critical dimension can be calculated by determining the difference between the actual critical dimension of a feature and the target critical dimension of the feature. In the embodiment of an SRAM, as discussed above, the SRAM mean is calculated by taking the difference between an actual SRAM critical dimension from the target SRAM critical dimension. This is done in 2D because the measurement is taken in a first dimension corresponding to the vertical/horizontal pattern, and a second dimension corresponding to the area critical dimension. Both of these are used to demonstrate the improved 2D fidelity. Using the patterned photomask stack 104, the 2D fidelity can be improved by 30%.

Figure 3:
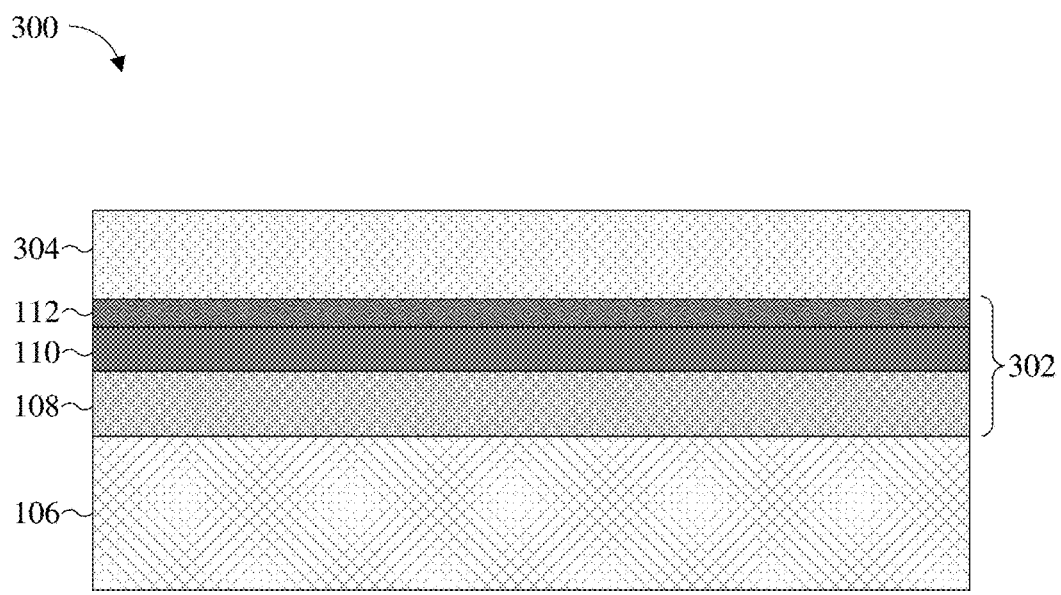
FIG. 3 illustrates an embodiment of a photomask stack having multiple shielding layers for mask patterning.

FIG. 3 illustrates an embodiment of a photomask stack 300 having multiple shielding layers for mask patterning. The photomask stack 302 overlies the transparent layer 106. A photoresist 304 overlies the photomask stack 302. The photoresist 304 is etched such that the photomask stack 302 can subsequently be etched into the sections as illustrated by the photomask of FIG. 1. The resulting photomask can be used is used in lithography to pattern a wafer.

The photomask stack 302 includes contiguous layers of the phase shift layer 108, the first shielding layer 110, and the second shielding layer 112. The phase shift layer 108 overlies the transparent layer 106. In some embodiments, the phase shift layer 108 has a thickness in a range of about 60 nm to about 80 nm and is comprised of a phase shift material. The first shielding layer 110 and the second shielding layer 112 are configured to block the transmission of electromagnetic radiation. Accordingly, the first shielding layer 110 and the second shielding layer 112 are opaque.

The parameters (e.g., thickness, material, etc.) of the first shielding layer 110 and the second shielding layer 112 are tunable such that the properties (e.g., susceptibility to etchant, optical properties, etc.) of the first shielding layer 110 and the second shielding layer 112 can be selected. Tuning the parameters of the first shielding layer 110 and the second shielding layer 112 may also simplify the patterning process.

Suppose, the first shielding layer 110 is comprised of a first material and the second shielding layer 112 is comprised of a second material. In some embodiments, the first material and the second material have different chemical compositions. For example, the shielding layers may be comprised of different transition metals. In one embodiment, the first material may include a group five transition metal, such a tantalum, and the second material may include a group six transition metal, such as chromium. The first material and the second material may be selected so that both the first shielding layer 110 and the second shielding layer 112 can be etched by the same etchant, a first etchant. Accordingly, the first shielding layer 110 and the second shielding layer 112 can be etched in a single step rather than individual etching steps per layer. To further simplify the process, the first material may be selected such that the phase shift material of the phase shift layer 108 and the first material can be etched together using a second etchant.

Additionally or alternatively to selecting materials based on their etching properties, the materials may be selected based on their optical properties. The optical properties may be based on the thickness of the layer. In one embodiment, the first shielding layer 110 has first thickness of approximately 20 nm to 28 nm. In another embodiment, the second shielding layer 112 has a second thickness of approximately 3 nm to 7 nm. The materials or properties of the first shielding layer or the second shielding layer may also be selected based on the materials or properties of the other.

For example, the first material of the first shielding layer 110 may be selected based on the second shielding layer 112 being 5 nm thick and having an optical density of 0.23. In one embodiment, the first shielding layer 110 may be selected for having an optical density of 1.6 when 24 nm thick, which would achieve a desired optical density of greater than 1.8 when the optical densities of the first shielding layer 110 and the second shielding layer 112 are combined.

Accordingly, the combined optical density of the first shielding layer 110 and the second shielding layer 112 is greater than 1.8 with a combined thickness of 29 nm, instead of the typical, larger, 52 nm single shielding layer of chromium.

Figure 4A:
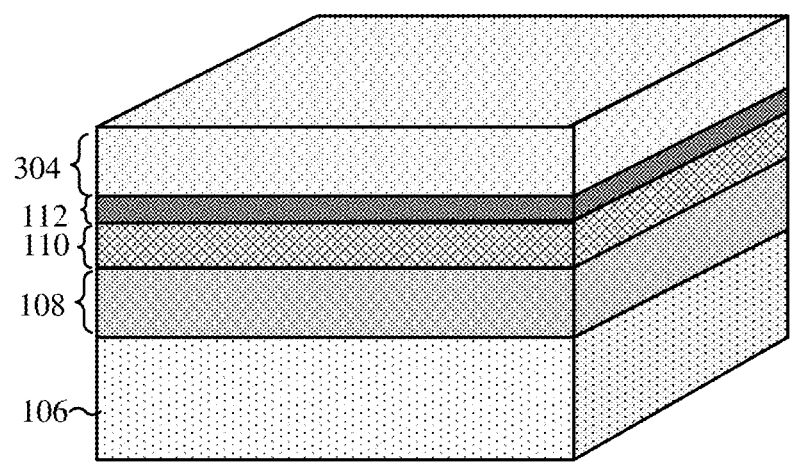
FIGS. 4A-4D illustrate embodiments of a photomask stack being etched to form the patterned photomask having multiple shielding layers.

FIG. 4A illustrates an embodiment of a photomask stack having multiple shielding layers for mask patterning. The photomask stack 400 includes the layers described above with respect to FIG. 3 and the layers function in a similar manner. For example, the photomask stack 400 includes continuous layers of the transparent layer 106, the phase shift layer 108, the first shielding layer 110, the second shielding layer 112, and the photoresist 304. Here the layers are continuous because the photomask stack 400 is illustrated before etching has occurred.

Figure 4B:
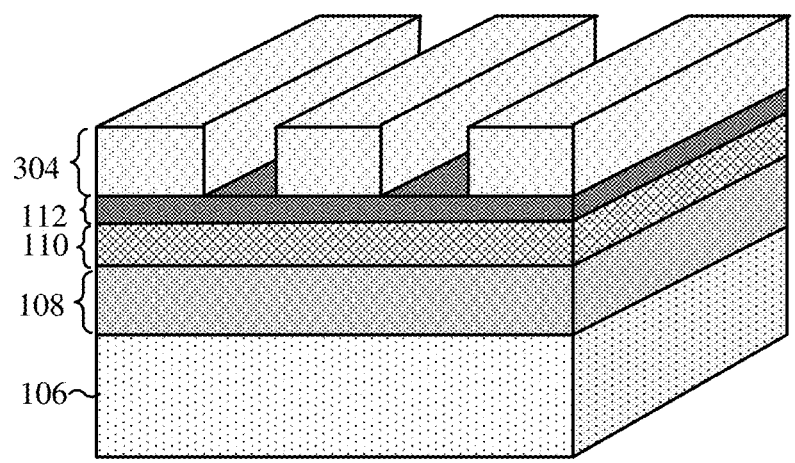

FIG. 4B illustrates one embodiment of a photomask stack 402 in which the photoresist 304 has been etched to expose a portion of the second shielding layer 112. The photoresist 304 is etched based on desired pattern of the resulting patterned photomask, as shown by the photomask of FIG. 1. The photoresist 304 prevents areas of the underlying second shielding layer 112 from being etched. However, exposed portions of the second shielding layer 112 will be able to be etched.

Figure 4C:
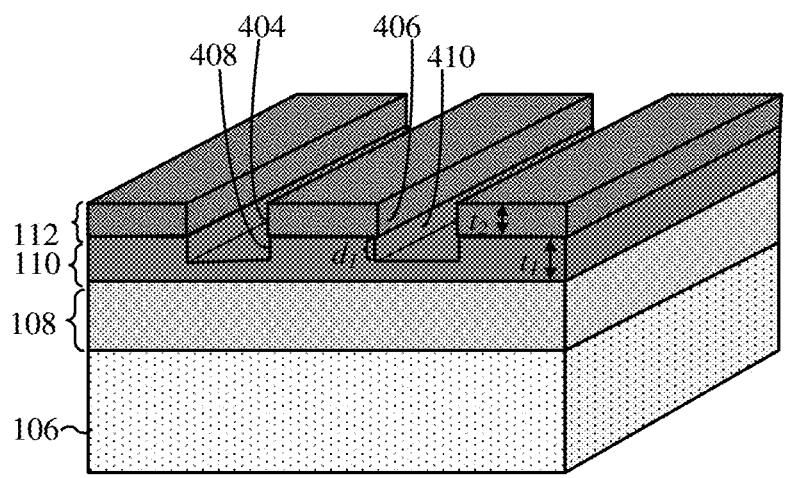

FIG. 4C illustrates one embodiment of the first shielding layer 110 and the second shielding layer 112 having been etched. As discussed above with respect to FIGS. 2A and 2B, the first shielding layer 110 and the second shielding layer 112 may be etched by a single etchant in one process step. Accordingly, when the second shielding layer 112 is etched at least a portion of the first shielding layer 110 underlying the second shielding layer 112 is also etched.

Suppose that the first shielding layer 110 has a thickness, $t_1$, the second shielding layer 112 has a thickness $t_2$, and that the first shielding layer 110 and the second shielding layer 112 are etched with a first etchant. The first etchant may be include a chemical composition of chlorine and oxygen. In some embodiments, the first etchant etches the entire thickness $t_2$, of the second shielding layer 112 at portions of the second layer exposed by the photoresist 304, as shown above in FIG. 4B. Thus, the first etchant etches the second shielding layer 112 into sections. In particular, the second shielding layer 112 is separated into a plurality of second layer shielding sections separated by gaps.

Furthermore, portions of the first shielding layer 110 underlying the gaps in the second shielding layer 112 are also etched to form a plurality of first layer shielding sections. For example, the gaps of the second shielding layer 112 have a first sidewall 404 and a second sidewall 406. Because the first etchant partially etches the first shielding layer 110 too, there are sections of the first shielding layer that are also separated by gaps. The sidewalls of the gaps in the first shielding layer 110 are aligned with the first sidewall 404 and the second sidewall 406 of the second shielding layer 112. In this manner, the first etching step forms a plurality of shielding sections in the shielding layers.

The first sidewall 404 of the second shielding layer 112 is aligned with the first sidewall 408 of the first shielding layer 110. Likewise, the second sidewall 406 of the first shielding layer 110 is aligned with the second sidewall 410 of the second shielding layer 112. In some embodiments, the first sidewall 408 and the second sidewall 410 of the first shielding layer 110 may not extend through the thickness, $t_1$. Instead, the first sidewall 408 and the second sidewall 410 of the first shielding layer 110 may extend to a first depth, $d_1$, that is less than the thickness, $t_1$, of the first shielding layer 110.

Figure 4D:
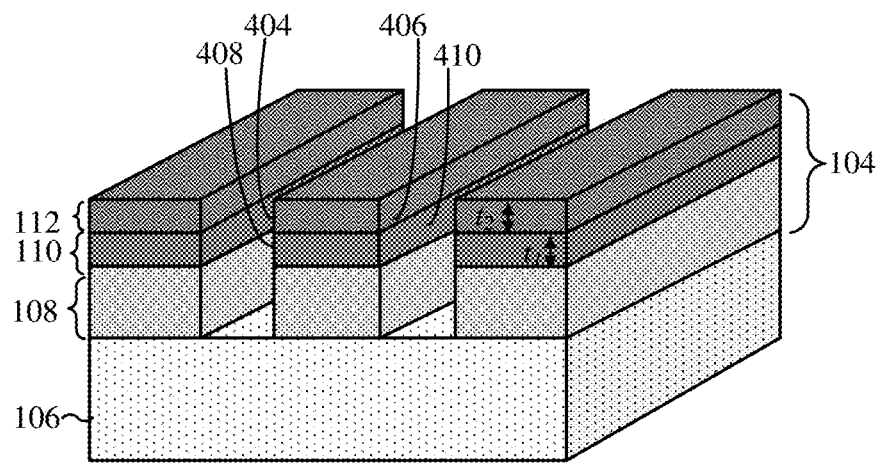

FIG. 4D illustrates a patterned photomask 412 having etched phase shift layer 108, an etched first shielding layer 110, and an etched second shielding layer 112. For example, a remaining portion of the first shielding layer 110 is arranged between the first sidewall 408 and the second sidewall 410 is removed. As discussed above, both the phase shift layer 108 and the first shielding layer 110 may be etched using the second etchant. The second etchant may have a chemical composition including fluorine and oxygen. Thus, the phase shift layer 108 is etched such that portions of the phase shift layer 108 are removed while portions underlying the sections of the first shielding layer 110 and the second shielding layer 112 remain. In this manner, the second etching step forms a plurality of phase shift sections in the phase shift layer by etching through the first shielding layer.

Accordingly, in one embodiment, the phase shift layer 108, the first shielding layer 110, and the second shielding layer 112 are etched into a plurality of patterned photomask sections having aligned sidewalls. Due to the selection of materials the three layers: the phase shift layer 108, the first shielding layer 110, and the second shielding layer 112 may be etched using two etching steps rather than each layer requiring an individual etching step. Thus, the process of forming the patterned photomask 104 can be simplified.

FIGS. 5-15 cross-sectional views of some embodiment of views of some embodiments of a photomask at various stages of patterning are provided. The structures disclosed in FIGS. 5-15 are not limited to a particular method, but instead may stand alone as structures independent of the method.

Figure 5:
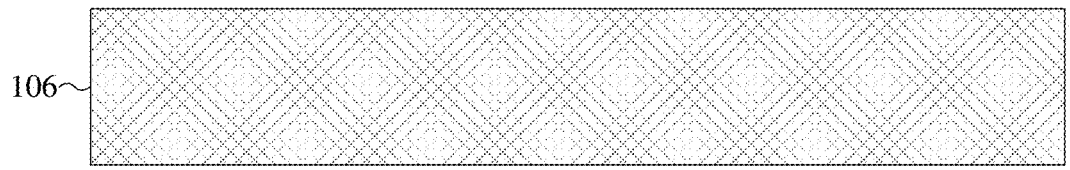
FIGS. 5-15 illustrate a series of cross-sectional views of some embodiments of a photomask at various stages of formation, the photomask stack and the patterned photomask having a plurality of shielding layers.

At FIG. 5, a transparent layer 106 is received. The transparent layer 106 may be, for example, quartz, carbide substrate, or a silicon substrate. The transparent layer 106 may have, for example, a thickness of between about 6-7 millimeters (mm). In some embodiments, the transparent layer has a thickness of approximately 6.35 mm. The transparent layer 106 acts a substrate for formation of the photomask stack 302.

Figure 6:
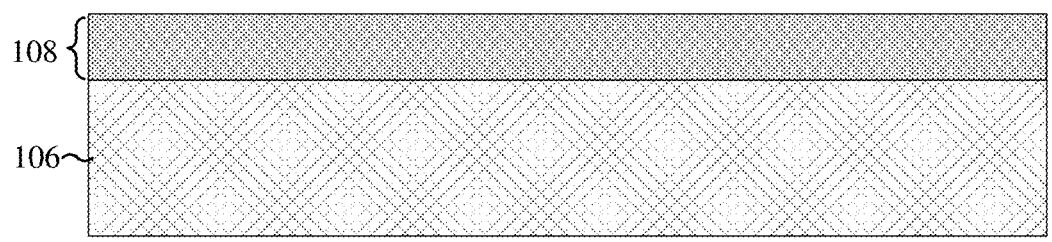

As illustrated by FIG. 6, a phase shift layer 108 is formed over the transparent layer 106. The phase shift layer 108 is comprised of a phase shift material. For example, the phase shift material may be an opaque layer of molybdenum silicide (MoSi). As described above, the phase shift layer 108 is configured to allow only a small percentage of light to pass. Accordingly, in some embodiments, the phase shift layer 108 is not formed as alternating layers of molybdenum and silicide, like a Bragg reflector. Instead, the phase shift layer 108 is formed as an opaque shielding layer of MoSi that is used during photolithographic exposures to aid patterning of deep ultraviolet radiation. In other embodiments, the phase shift layer 108 comprises an opaque layer of molybdenum silicide oxynitride ($Mo_xSi_yON_z$), which is used as a half tone material in optical lithography.

Figure 7:
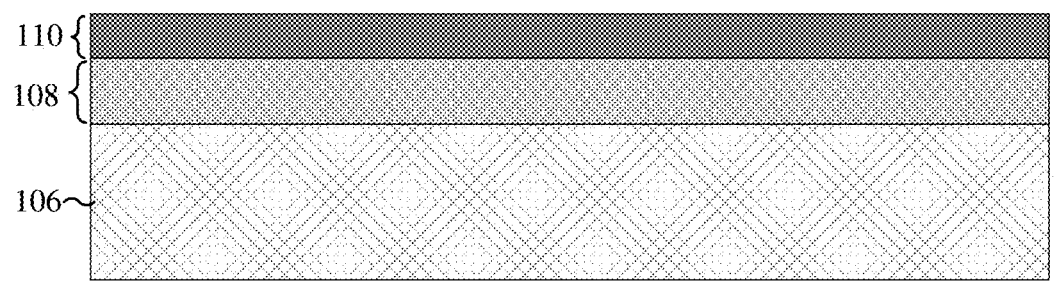

As illustrated by FIG. 7, a first shielding layer 110 is formed over the phase shift layer 108. The first shielding layer 110 may have a thickness in a range between about 18 nm to about 30 nm. In some embodiments, the first shielding layer 110 may be comprised of a first material, such as tantalum (Ta), for example, tantalum borate ($B_5O_{15}Ta_3$). The first material may be selected for having a high optical density despite a thinner thickness. Alternatively or additionally, the first material may be selected based on its ability to be etched by particular etchant.

Figure 8:
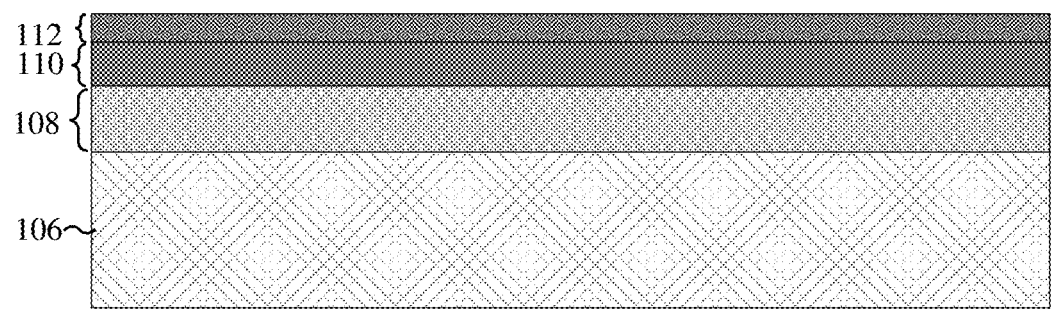

As illustrated by FIG. 8, a second shielding layer 112 is formed over the first shielding layer 110. The second shielding layer 112 may have a thickness in a range between about 1 nm to about 10 nm. Accordingly, the first shielding layer 110 may have a greater thickness than the second shielding layer 112. In some embodiments, the second shielding layer 112 may be comprised of a second material. The second material may be selected based on an optical property of the second material at a specific thickness. For example, the second material may be selected based on it optical density or reflectivity. In some embodiments, the second material may be chromium (Cr) or a Cr based material. In some embodiments, the second material is chromium oxide ($CrO_x$) or chromium nitride ($CrN_x$).

Figure 9:
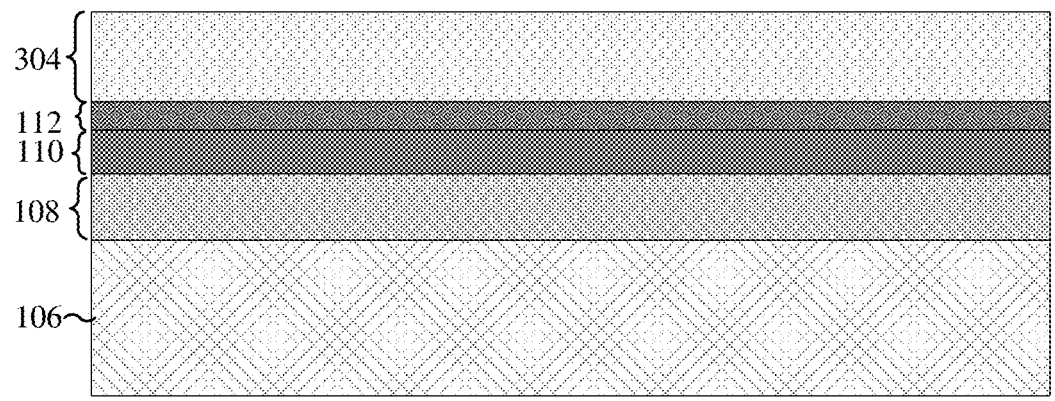

As illustrated by FIG. 9, a photoresist 304 is formed over the second shielding layer 112. The photoresist 304 may have a thickness in a range between about 10 nm and about 100 nm. In some embodiments, the photoresist 304 may comprise a chemically amplified resin (CAR). The photoresist 304 may comprise a positive tone photoresist, which becomes soluble when exposed to radiation. In other embodiments, the photoresist 304 may comprise a negative tone photoresist, which becomes insoluble when exposed to radiation.

Figure 10:
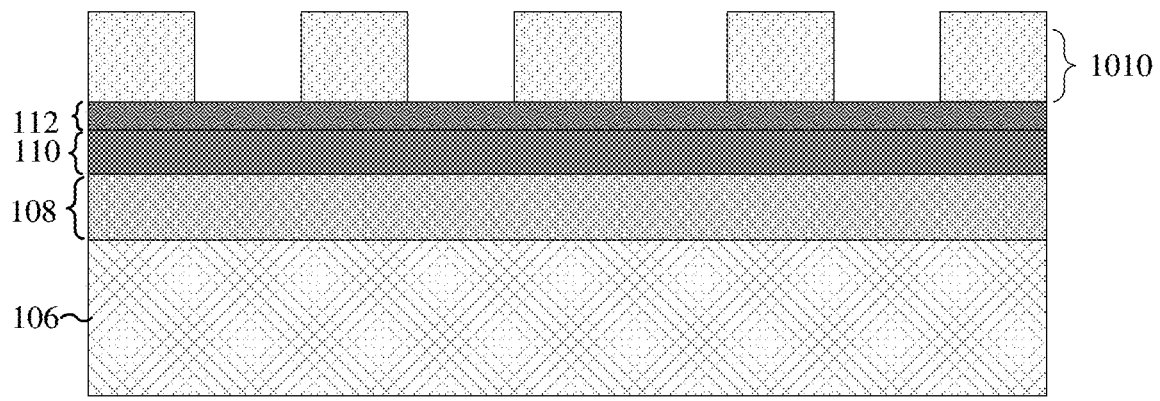

As illustrated by FIG. 10, the photoresist 304 is etched into photoresist sections 1010 through exposure. For example, the photoresist 304 may be exposed using an electron beam (e-beam) writer. The exposed photoresist material is subsequently developed to remove weaker sections of the exposed photoresist material. In some embodiments, the layer of photoresist may be exposed using an electron beam (e-beam) writer. The exposed photoresist layer 304 is subsequently developed to remove weaker sections of the exposed photoresist material.

Figure 11:
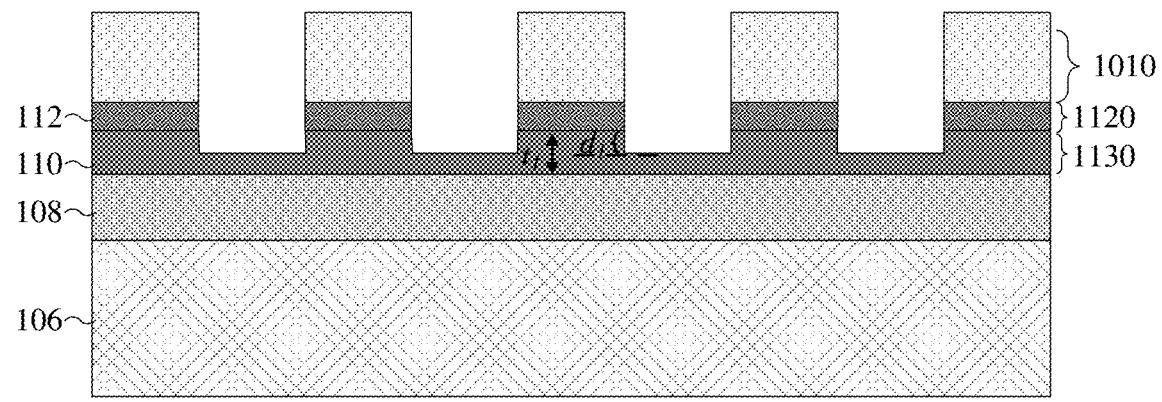

As illustrated by FIG. 11, the first shielding layer 110 and the second shielding layer 112 may be etched by a first etchant. In various embodiments, the first etchant may comprise a dry etchant have an etching chemistry comprising a chlorine species (e.g., $Cl_2O_2$, etc.) and oxygen, or a wet etchant. The first etchant, like the first material and second material is selected such that it is able to etch both the first material and at least a portion of the second material. The first etchant may be applied for a first predetermined time to etch the first and second shielding layers.

The second shielding layer 112 is etched into a plurality of second shielding sections 1120, and the first shielding layer 110 is at least partially etched into a plurality of first shielding sections 1130 underlying the photoresist sections 1010. For example, the first shielding layer 110 may be etched into a plurality of first shielding sections 1130 having sidewalls that extend to a first depth, $d_1$, in the first shielding layer 110 that is less than the thickness, $t_1$, of the first shielding layer 110.

Figure 12:
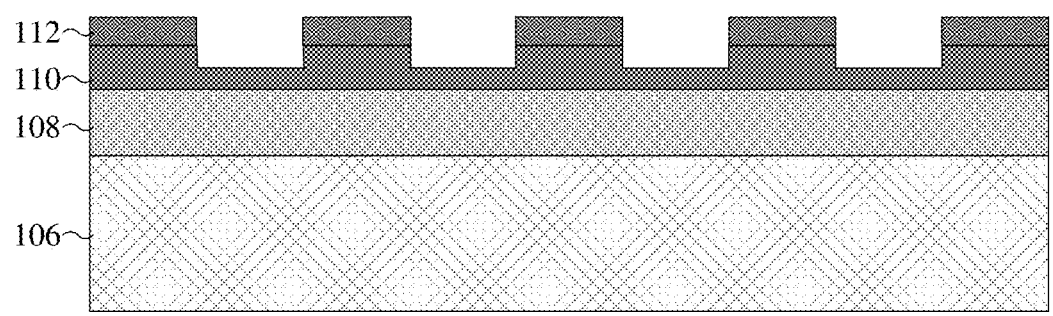

As illustrated by FIG. 12, the photoresist sections 1010 is stripped from the photomask stack.

Figure 13:
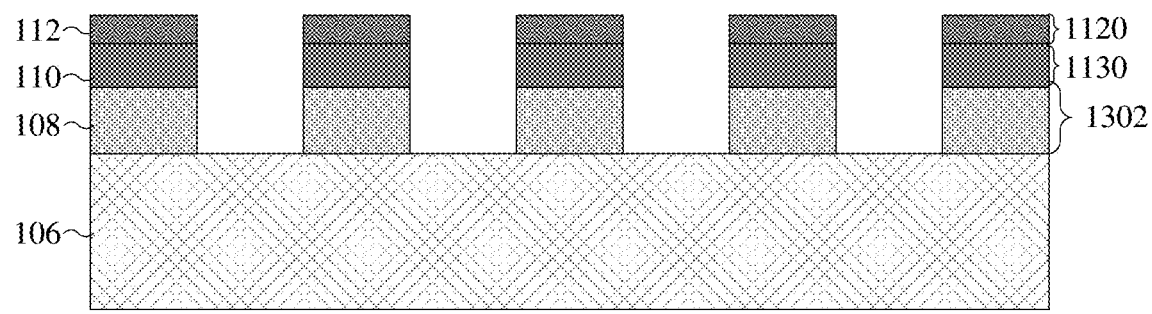

As illustrated by FIG. 13, the first shielding layer 110 and the phase shift layer 108 may be etched by a second etchant. In various embodiments, the second etchant may comprise a dry etchant have an etching chemistry comprising a fluorine species (e.g., $CF_4$, $CHF_3$, $C_4F_8$, $SF_6$, etc.) and oxygen, or a wet etchant (e.g., vapor-phase hydrofluoric acid (vHF), hydrofluoric acid (HF), BOE, or Tetramethylammonium hydroxide (TMAH)). The second etchant, like the first material and phase shift material, may be selected such that it is able to etch both the first material and the phase shift material can be etched in single process step. The second etchant may be applied for a second predetermined time to etch the second shielding layer, with the second predetermined time being the same or different from the first predetermined time.

The second etchant etches through the remainder of the first shielding layer 110 between the first shielding sections 1130 such that the first shielding sections 1130 are separated by gaps. Accordingly, the portions of the first shielding layer 110 between the first shielding sections 1130 equal to the thickness, $t_1$ (shown in FIG. 11), of the first shielding layer 110 minus the first depth, $d_1$ (shown in FIG. 11), are removed. Likewise, the phase shift layer 108 is etched by the second etchant, in that etching step, such that phase shift sections 1302 underlie and are aligned with the first shielding sections 1130. The second etchant stops of the transparent layer 106, such that upper surface of the transparent layer 106 remains substantially planar or substantially in place.

Figure 14:
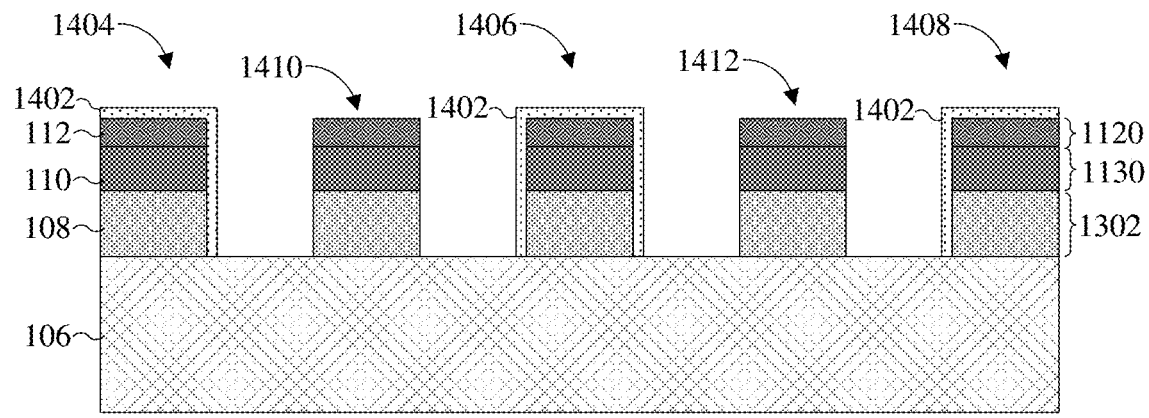

As illustrated by FIG. 14, a protective layer 1402 is formed over at least one of the second shielding sections 1120. Here, protected sections 1404, 1406, and 1408 have the protective layer 1402. Unprotected sections 1410 and 1412 do not have the protective layer 1402. In some embodiments, the protective layer 1402 may extend down the sidewalls of the second shielding sections 1120, first shielding sections 1130, and phase shift sections 1302. Protective layer 1402 can be photoresist, for example, or can be a protective nitride, oxide or other material that have been patterned and etched using a photomask (not shown).

Figure 15:
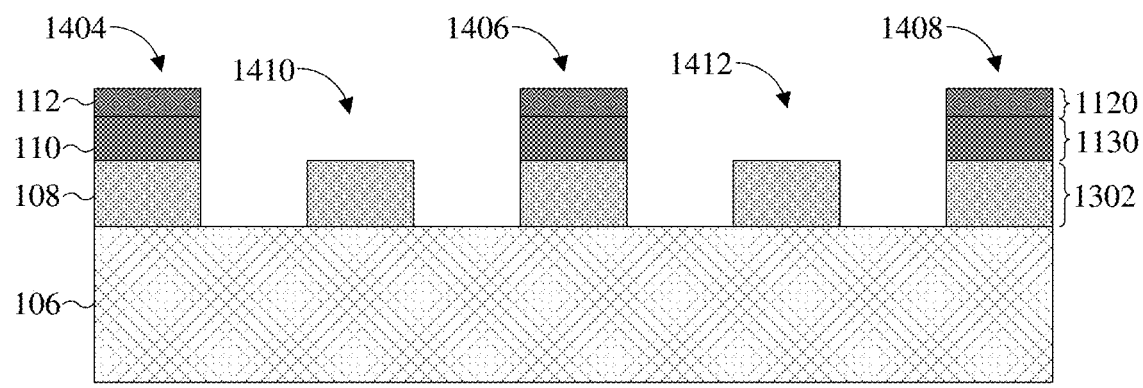

As illustrated by FIG. 15, unprotected sections 1410 and 1412 are etched to remove the first shielding sections 1130 and second shielding section 1120, such that there are not layers overlying the phase shift sections 1302 of the unprotected sections. Then the protective layer 1402 can be removed from the protected sections 1404, 1406, and 1408.

Figure 16:
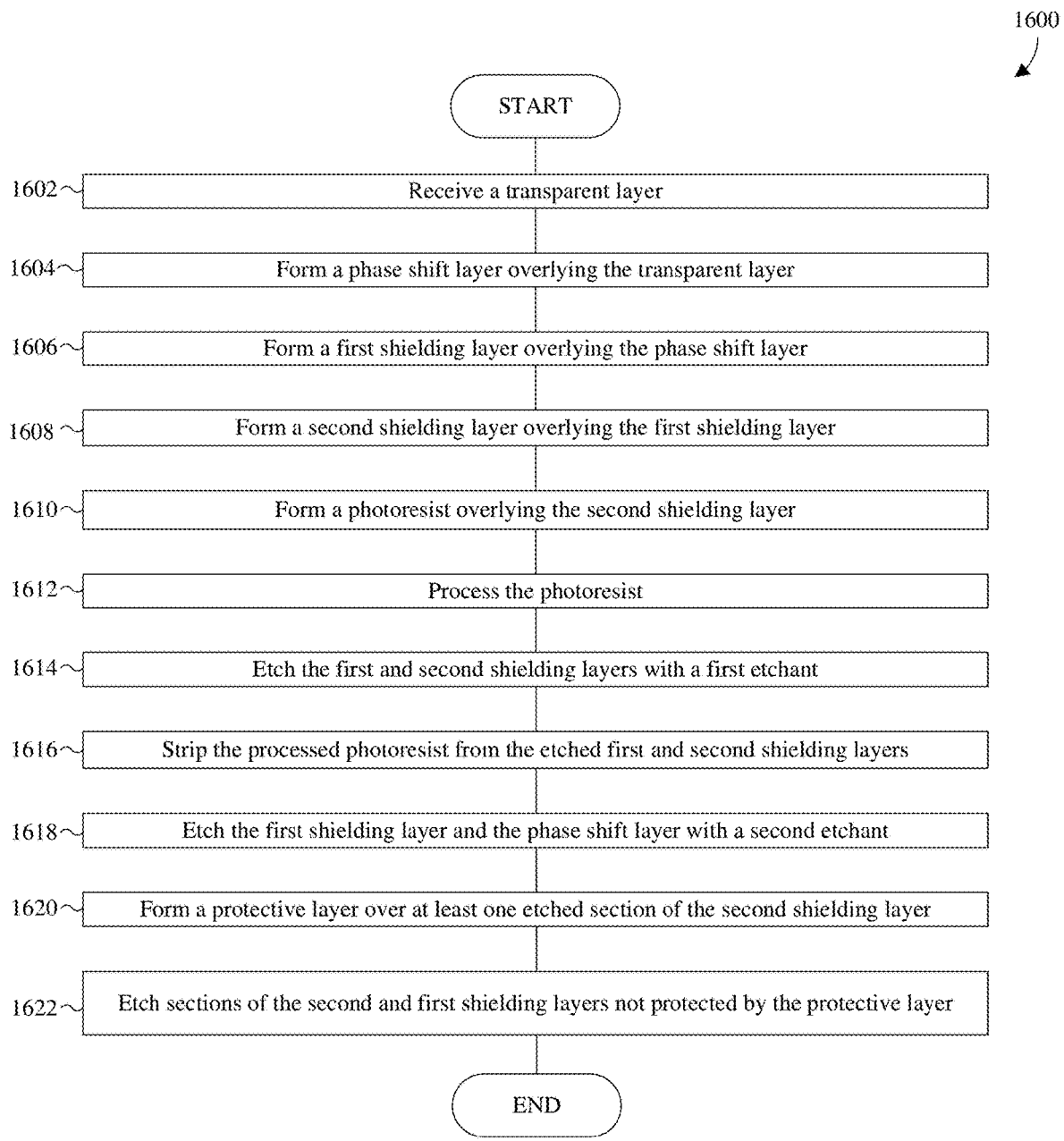
FIG. 16 illustrates a flowchart of some embodiments of a method for forming a photomask stack and subsequent photomask having a plurality shielding layers.

With reference to FIG. 16, a flowchart 1600 of some embodiments of the method of FIGS. 5-15 is provided.

At 1602, a transparent layer is received as a substrate. See, for example, FIG. 5.

At 1604, a phase shift layer is formed over the transparent layer. In some embodiments the phase shift layer is comprised of molybdenum silicide (MoSi). See, for example, FIG. 6, At 1606, a first shielding layer is formed over the phase shift layer. The first shielding layer is comprised of a first material. The first material may be selected for specific optical properties. For example, a specific optical density at a particular thickness. See, for example, FIG. 7.

At 1608, a second shielding layer is formed over the first shielding layer. The second shielding layer is comprised of a second material. The second material may be selected for specific optical properties, such that the first shielding layer and the second shielding layer have a desired optical property and/or physical characteristic, such as the ability to be etched by the same etchant. The phase shift layer, the first shielding layer, and the second shielding layer form a photomask stack. See, for example, FIG. 8.

At 1610, a photoresist is formed over the second shielding layer. See, for example, FIG. 9.

At 1612, the photoresist is processed. In some embodiments, the transparent layer, photomask stack, and the photoresist layer are baked in a post exposure bake. The photoresist is etched to form a plurality of photoresist sections based on a desired pattern. See, for example, FIG. 10.

At 1614, the first shielding layer and the second shielding layer are etched with a first etchant to form a plurality of first shielding sections. Each first shielding section has a first shielding first sidewall and a first shielding second sidewall. A first photoresist sidewall is aligned with the first shielding first sidewall and a second photoresist sidewall is aligned with the first shielding second sidewall. See, for example, FIG. 11.

At 1616, the photoresist is stripped once the first shielding layer and second shielding layer are etched. In some embodiments, this involves stripping the photo resist sections. See, for example, FIG. 12.

At 1618, the first shielding layer and the phase shift layer are etched with a second etchant to form a plurality of second shielding sections aligned with the plurality of first shielding sections. See, for example, FIG. 13.

At 1620, a protective layer is formed over at least some of the second shielding layers. The protective layer may extend down the sidewalls of the second shielding sections, first shielding sections, and phase shift sections. See, for example, FIG. 14.

At 1622, sections not covered by the protective layer are etched to remove the first shielding sections and the second sections, leaving the phase shift section. See, for example, FIG. 15.

Accordingly, the patterned photomask having a plurality of shielding layers is described. The materials of the first and second shielding layers is selected for desired optical properties and physical characteristics of the combined first and second shielding layers. For example, if a first shielding layer is selected for an optical property, such as, absorbance, the second shielding layer may be selected for to improve other optical properties of the combined first and second shielding layer. In one embodiment, the second shielding layer may be selected so that the combined first and second shielding layers have a desired optical density or thickness. Furthermore, the materials for the first and second shielding layers may be selected so that both the first and second shielding layer can be etched by a first etchant. Likewise, the material of the first shielding layer may be selected so that a second etchant can etch both the first shielding layer and the phase shift layer. Thus, the first shielding layer does not require an individual etching step. In this manner, the process for creating the photomask can be simplified.

In some embodiments, a photomask for mask patterning is described. The photomask includes a phase shift layer overlying a transparent layer. The photomask also includes a first shielding layer overlying the phase shift layer. The first shielding layer has a first thickness and a first optical density. The photomask further includes a second shielding layer overlying the first shielding layer. The second shielding layer has a second thickness and a second optical density. The second thickness is less that than the first thickness and the second optical density is less than the first optical density.

In some embodiments, a photomask for mask patterning includes a phase shift layer comprised of molybdenum silicide (MoSi) overlying a transparent layer comprised of quartz. The photomask further includes a first shielding layer overlying the phase shift layer. The first shielding layer is comprised of tantalum borate and has a first thickness of approximately 20 nm to 28 nm. The photomask also includes a second shielding layer overlying the first shielding layer. The second shielding layer is comprised of chromium nitride and has a second thickness of approximately 3 nm to 7 nm.

In some embodiments a method of forming a photomask is described. The method includes forming a phase shift layer comprised of molybdenum silicide (MoSi) overlying a transparent layer comprised of quartz. The method also includes forming a first shielding layer overlying the phase shift layer. The first shielding layer has a first thickness and a first optical density. The method also includes forming a second shielding layer overlying the first shielding layer. The second shielding layer has a second thickness and a second optical density. The second thickness is less that than the first thickness and the second optical density is less than the first optical density. The method also includes forming a photoresist layer overlying the second shielding layer.

Although the disclosure has been shown and described with respect to a certain aspect or various aspects, equivalent alterations and modifications will occur to others of ordinary skill in the art upon reading and understanding this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the disclosure. In addition, while a particular feature of the disclosure may have been disclosed with respect to only one of several aspects of the disclosure, such feature may be combined with one or more other features of the other aspects as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A photomask for mask patterning, comprising:
    a transparent layer comprising quartz;
    a molybdenum silicide (MoSi) layer overlying the transparent layer;
    a first shielding layer overlying the MoSi layer, wherein the first shielding layer has a first thickness and a first optical density; and
    a second shielding layer overlying the first shielding layer, wherein the second shielding layer has a second thickness less than one third of the first thickness and has a second optical density that is less than one fourth of the first optical density, and wherein an overall optical density of the first and second shielding layers is at least 1.8.

2. The photomask of claim 1, wherein the second shielding layer comprises chromium.

3. The photomask of claim 1, wherein the second shielding layer has a thickness of 3 nm to 7 nm.

4. The photomask of claim 1, wherein the first shielding layer comprises boron.

5. The photomask of claim 1, wherein the MoSi layer covers some portions of the transparent layer while leaving other portions of the transparent layer uncovered.

6. The photomask of claim 1, wherein the first shielding layer covers some portions of the MoSi layer but leaves other portions of the MoSi layer uncovered.

7. The photomask of claim 1, wherein the second shielding layer comprises chromium nitride.

8. A photomask for mask patterning, comprising:
    a transparent layer comprising quartz;
    a molybdenum silicide (MoSi) layer overlying the transparent layer;
    a first shielding layer overlying the MoSi layer, the first shielding layer comprising a transition metal or a post transition metal, wherein the first shielding layer has a first thickness and a first optical density; and
    a second shielding layer overlying the first shielding layer and comprising chromium, wherein the second shielding layer has a second thickness less than one half of the first thickness and has a second optical density that is less than one half of the first optical density, and wherein an overall optical density of the first and second shielding layers is greater than 1.8.

9. The photomask of claim 8, wherein a total thickness of the first shielding layer and the second shielding layer ranges from approximately 19 nm to approximately 40 nm.

10. The photomask of claim 8, wherein a total thickness of the first shielding layer and the second shielding layer is approximately 29 nm.

11. The photomask of claim 8, wherein the second shielding layer comprises chromium nitride.

12. The photomask of claim 8, wherein the second shielding layer has a thickness of 3 nm to 7 nm.

13. The photomask of claim 8, wherein the second shielding layer covers some portions of the MoSi layer but leaves other portions of the MoSi layer uncovered.

14. The photomask of claim 8, wherein the first shielding layer comprises boron.

15. A photomask for mask patterning, comprising:
    a transparent layer comprising quartz;
    a molybdenum silicide (MoSi) layer overlying the transparent layer;
    a first shielding layer overlying the MoSi layer, the first shielding layer having a first thickness and a first optical density; and
    a second shielding layer overlying the first shielding layer, the second shielding layer having a second thickness and a second optical density;
    wherein a thickness ratio of the first thickness to the second thickness is greater than 3:1, and an optical density ratio of the first optical density to the second optical density is greater than 4:1.

16. The photomask of claim 15, wherein an overall optical density of the first and second shielding layers is at least 1.8.

17. The photomask of claim 15, wherein the first optical density is greater than 1 and the second optical density is less than 1.

18. The photomask of claim 15, wherein the MoSi layer covers some portions of the transparent layer while leaving other portions of the transparent layer uncovered.

19. The photomask of claim 15, wherein the second shielding layer comprises chromium nitride.

20. The photomask of claim 15, wherein the first shielding layer comprises $B_5O_{15}Ta_3$.

* * * * *